US006961246B2

(12) United States Patent
Dickey et al.

(10) Patent No.: US 6,961,246 B2
(45) Date of Patent: Nov. 1, 2005

(54) WORKSHELF FOR A COMPUTER RACK

(75) Inventors: Peter Dickey, Costa Mesa, CA (US); Kurt Buckland, Yorba Linda, CA (US)

(73) Assignee: Quantum Corporation, San Jose, CA (US)

( * ) Notice: Subject to any disclaimer, the term of this patent is extended or adjusted under 35 U.S.C. 154(b) by 191 days.

(21) Appl. No.: 10/658,928

(22) Filed: Sep. 9, 2003

(65) Prior Publication Data

US 2005/0052850 A1 Mar. 10, 2005

(51) Int. Cl.[7] .............................. H05K 5/00; H05K 5/02
(52) U.S. Cl. ...................... 361/724; 361/679; 360/69; 312/223.1; 248/286.1
(58) Field of Search ................................. 361/679–686, 361/724–727, 88, 92; 360/69, 71; 312/223.1, 223.2; 248/286.1, 291.1, 222.52

(56) References Cited

U.S. PATENT DOCUMENTS

| | | | |
|---|---|---|---|
| 5,351,176 A | | 9/1994 | Smith Stephen W. et al. |
| 5,388,032 A | * | 2/1995 | Gill et al. .................... 361/727 |
| 5,684,671 A | * | 11/1997 | Hobbs et al. ................ 361/683 |
| 6,157,534 A | * | 12/2000 | Gallagher et al. .......... 361/683 |
| 6,175,490 B1 | * | 1/2001 | Papa et al. ................... 361/686 |
| 6,201,690 B1 | | 3/2001 | Moore et al. |
| 6,283,429 B1 | * | 9/2001 | Markovich et al. ......... 361/683 |
| 6,347,020 B1 | * | 2/2002 | Carpenter et al. ............ 360/92 |
| 6,353,532 B1 | | 3/2002 | Landrum et al. |
| 6,452,788 B1 | * | 9/2002 | Crowley ...................... 361/683 |
| 6,501,020 B2 | | 12/2002 | Grant et al. |
| 6,511,139 B2 | | 1/2003 | Liu |
| 6,529,382 B2 | * | 3/2003 | Terao .......................... 361/726 |
| 6,621,692 B1 | * | 9/2003 | Johnson et al. ............. 361/683 |
| 6,710,962 B1 | * | 3/2004 | Caverly et al. ............... 360/69 |
| 2002/0108543 A1 | | 8/2002 | Wiggins |

OTHER PUBLICATIONS

Cases2Go (1996). Rackmount Case Accessories product descriptions located at: <http://www.cases2go.com/html/rackmount_accessories11.html> last visited on Jan. 28, 2003, six pages.

Gorilla Systems, Inc. (Date Unknown). 19"—24" Industrial Rack Mount (Rackmount) Computer PC Cases product description located at: <http://www.gorilla.net/index.html> last visited on Jan. 28, 2003, two pages.

Gorilla Systems, Inc. (Date Unknown). Gorilla Systems 1U Keyboard & 15.1" TFT/LCD Monitor+KVM Switch product description located at: <http://www.gorilla.et/goricp/gorlkm–815.html> last visited on Jan. 28, 2003, two pages.

Innovation First, Inc. (2002). 2 & 4 Post Heavy Duty Sliding Rack Mount Shelf product description located at: <http://www.racksolutions.com/rack–mount–shelf–sliding–heavy–duty–gallery.shtml> last visited on Jul. 31, 2003, two pages.

(Continued)

*Primary Examiner*—Lisa Lea-Edmonds
(74) *Attorney, Agent, or Firm*—Morrison & Foerster LLP

(57) ABSTRACT

A cabinet, rack frame or equipment that includes a temporary workshelf that may be stowed within the profile of a cabinet, rack frame or equipment when not in use. When in use, the workshelf extends to provide a work surface that may be used, for example to hold a laptop computer or other portable equipment, as a writing surface. The workshelf may be positioned in the cabinet or rack so that when extended, the workshelf provides an ergonomic work surface. Additionally, when extended, the workshelf may expose a portion of a front face of the cabinet, rack frame or equipment. The front face may house one or more functional units such as a data port, door latch, power switch, display or a control panel. When the workshelf is extended, a technician may have access to the functional units.

25 Claims, 6 Drawing Sheets

OTHER PUBLICATIONS

Lashen.com Electronics (1996). Rack Accessories product descriptions located at: <http://www.lashen.com/vendors/MAP/Rack_Accessories/Default.asp.> last visited on Jan. 28, 2003, four pages.

Middle Atlantic Products, Inc. (2000). SS Sliding Shelf product description, two pages.

Rackmount (Date Unknown). TMS 325 4U Rackmount Server product description located at: <http://www.rackmount.com/RackSvr–TM/TMS–325–EIDE.html> last visited on Jul. 31, 2003, three pages.

Rackmount Solutions (2001). Rackmount Shelves and Accessories product descriptions located at: <http://www.rackmountsolutions.net/Rackmount%20Shelves.asp.> last visited on Jul. 31, 2003, two pages.

SRO (Date Unknown). 1U Folding Rack Mount LCD Monitors product description located at: <http:www.server–rack–online.com/cyberview–rack–mount–lcd–monitors—1u–.html> last visited on Jan. 28, 2003, one page.

Tech World (2002). 19"Rack Mounted Keyboard Shelf product description located at <http://www.twstore.com/tw-store/rackkb.html> last visited on Jan. 28, 2003, one page.

The Graybow Group (2003). Winstead Corporation 85092 Angled Recessed Monitor Shelf product description located at: <http://216.245.175.12/AVCat/CTL683/index.cfm/mlc_id/743/SID/10197900/mrc_id/683/ProdID/67336/T3/168.html> last visited on Jul. 31, 2003, two pages.

Uptime Business Products (Date Unknown). Model ESIS56 product description located at: <http://www.afis–911–center.com/nema_enclosure2.html> last visited on Jan. 28, 2003, one page.

Uptime Business Products (Date Unknown). Model ESIS66–36 product description located at: <http://www.afis–911–center.com/nema_enclosure3.html> last visited on Jan. 28, 2003, one page.

* cited by examiner

WORKSHELF FOR A COMPUTER RACK

BACKGROUND OF THE INVENTION

1. Field of the Invention

The present invention relates generally to a workshelf for an electronic equipment cabinet or computer rack, and more particularly to a temporary shelf for a data storage system, wherein the shelf provides a temporary work surface.

2. Description of the Related Art

Mass data storage systems, tape backup systems, automated tape library systems, electronic test equipment, telecommunications equipment, network servers, routers and firewalls are often mounted in cabinets and rack mount frames. Multiple cabinets, which may be numerous enough to fill a room, are typically placed in an equipment room in rows thereby creating narrow aisles. When installing and monitoring the racks of equipment, operators, service personnel and technicians have little available work space for placing portable equipment and writing notes. Presently, portable equipment is placed on the floor, on top of other equipment or on dedicated shelves. This portable equipment may be, for example, a laptop computer, a data interface analyzer such as an Ethernet analyzer, or a customized diagnostic tool. Additionally, only the vertical faces of equipment and tops of nearby equipment provide a useful writing surface.

To provide a horizontal surface for portable equipment and for writing, some cabinets and racks incorporate pull-out shelves and pull-out drawers. A pull-out device occupies valuable rack space, which cannot otherwise be used by rack mountable equipment. Additionally, pull-out devices use rollers and slides, which increase a shelf's cost and increase the risk of necessary future maintenance and replacement.

Alternatively, a horizontal surface may be provided by a fixed shelf. A fixed shelf mounts within the body of a cabinet or a rack frame to provide support for electronic equipment. Though a fixed shelf is relatively inexpensive, it often requires several units of vertical rack space to be functional and therefore displaces other equipment that could otherwise occupy that vertical rack space. In other words, to be reserved as a surface for portable equipment or as a writing surface, a shelf would remain empty when a technician is not using it. Thus, valuable rack space is left unutilized for a majority of the time.

Still other racks provide a horizontal surface by way of a fixed shelf that protrudes from the cabinet or rack frame. These shelves permanently extend into the aisle, thus requiring cabinets and racks to be spaced farther apart in order to maintain the width of the aisles between the rows of cabinets.

Therefore, what is needed is a system that provides a temporary horizontal surface when in use and that minimizes the occupied vertical rack displacement in a cabinet or rack frame when not in used.

BRIEF SUMMARY OF THE INVENTION

In some exemplary embodiments, a cabinet for an electronics system having a fold-out shelf is provided. The fold-out shelf may be attached to and part of equipment installed in a cabinet. Alternatively, the fold-out shelf may be attached to a front face of the cabinet. When positioned horizontally, the shelf provides a work surface that may be used to support a laptop computer or other portable equipment or may be used as a writing surface. If stowed vertically, the shelf may act as a cover to protect the front face of the equipment. In some embodiments, the shelf is attached by a hinge at the front face of cabinet. In other embodiments, the shelf is attached by a hinge at the front face of equipment in a cabinet or rack frame.

In some embodiments, when the foldout shelf is positioned horizontally, a panel is exposed. When exposed, the panel provides a technician access to front panel controls and functional units such as a door latch, a power switch or a data port.

In other exemplary embodiments, the shelf slides out from the cabinet. When pulled out, the shelf provides a working surface. When pushed in, at least a majority of the shelf is out of the way. Still in other embodiments, the shelf is removable and may be temporarily attached to brackets or the like for positioning in a horizontal orientation.

The present invention and its various embodiments are better understood upon consideration of the detailed description below in conjunction with the accompanying drawing and claims.

DETAILED DESCRIPTION OF THE INVENTION

The present invention provides an electronic rack of equipment mounted in a cabinet or rack frame having an easily accessible work surface for supporting a laptop computer or other portable equipment or for writing notes. The rack of equipment may form a mass data storage system, an automated tape storage system, telecommunications equipment, or the like. In an extended position, a work surface is operable to provide an ergonomic setting for placing portable equipment or for writing notes. In a stowed position, the work surface minimizes its displacement of electronic equipment in a cabinet or rack. Unsafe and non-ergonomic use of the floor area in front of the cabinets may be reduced or eliminated by use of the temporary work surface provided by the present invention.

In some embodiments, a fold-out shelf for a cabinet or rack of equipment is provided. The fold-out shelf may be attached to and be part of equipment installed in the cabinet or may be part of the front face of the cabinet. Additionally, the shelf may be recessed or partially recessed into the face of the equipment or cabinet. When folded out, the shelf provides a surface that may be used to support a laptop computer or other portable equipment or may be used as a writing surface. Additionally, when folded out, the shelf may provide access to a position of the front face of equipment in the cabinet or rack. When folded in and closed, the shelf may act as a cover to protect a portion of the front face of the cabinet or mounted equipment.

Figure 1A:
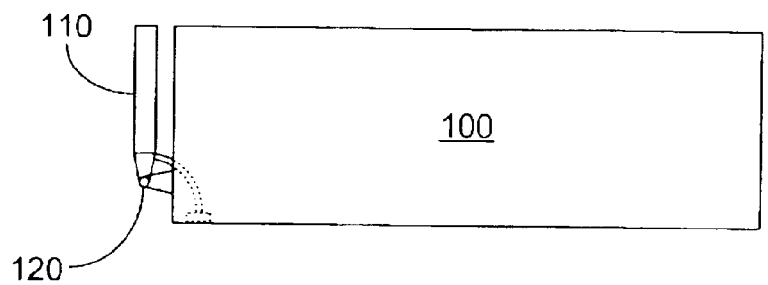
FIGS. 1A, 1B and 1C show various views of a unit of electronic equipment having a fold-down work surface.
Figure 1B:
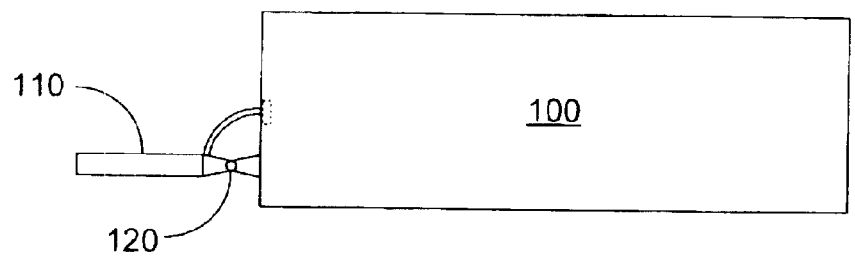
Figure 1C:
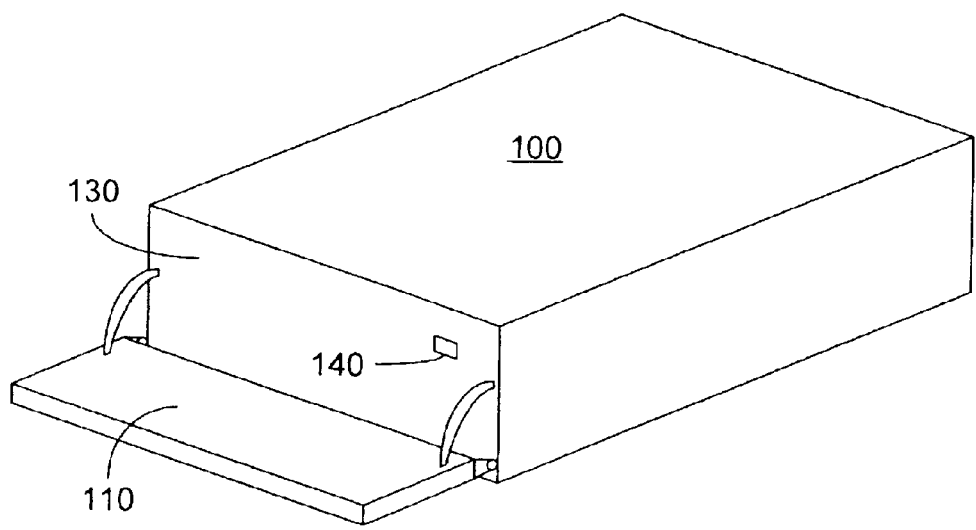

FIGS. 1A, 1B and 1C show various views of a unit of electronic equipment having a fold-down workshelf thereby providing a work surface. FIG. 1A shows a side view of a mountable unit of electronic equipment 100 having a fold-down workshelf 110 where the workshelf 110 is in a stowed position. For illustrative proposes, the workshelf 110 is shown attached to the body of the equipment 100 with a hinge 120. The workshelf 110 may be attached with a hinge 120, pin or other suitable means. The workshelf 110 may be recessed such that when the workshelf 110 is stowed, it does not protrude or only partially protrudes from the face of the mounted equipment.

The workshelf 110 could be equivalently attached to a front face of a cabinet, or to a rack frame rather than on the body of equipment 100. The workshelf 110 may be recessed such that when stowed, it does not protrude or only partially protrudes from the face of the equipment 100 or the cabinet in which it is installed.

The workshelf 110 is shown attached to the body of the equipment 100 such that when stowed, the workshelf 110 is held in the stowed position. A stowed workshelf 110 may act as a cover to protect the front face 130 of the equipment 100 from incidental contact or accidental damage. The stowed workshelf 110 may also act to limit or inhibit unauthorized access to functional units such as door latches, other latches controls, data ports, power switches, and/or status displays on the front face 130 of the equipment 100.

In some embodiments, the workshelf 110 is held in place by a simple latch when stowed. In other embodiments, the workshelf 110 is held in place with a more sophisticated latching mechanism such as, for example, a keyed locking mechanism, which provides further security from unauthorized access to the controls and data ports on the front face 130 of the equipment 100.

In some embodiments, the equipment 100 may be rack mountable. Some equipment 100 may incorporate rack brackets, rack slides or the like to provide rack mountable supports. Alternatively, the equipment 100 may be placed on an internal fixed shelf of a cabinet assembly or rack frame. In either case, the workshelf 110 may provide an integrated work surface when extended and a cover to a portion of the equipment when stowed.

The workshelf 110 may be part of a data storage system or an automated tape library system, such as Quantum Corporation's PX-720. Such systems, having high performance high capacity, high density and high reliability, often include a user interface for maintenance, control, monitoring and configuration. This user interface is often placed on the front panel of the system for accessibility. Usually, these systems also provide a complete user interface at a remotely positioned workstation, which may be located in the next room or across the country. In such systems, both the system and the remotely positioned workstation are interconnected via a network, for example, a local area network. An Ethernet connection provided at the back of the system may be connected to a network to which the remotely positioned workstation is also connected. The remotely positioned workstation allows the technician the ability to perform remote command, control, diagnostics, monitoring or similar functions from the workstation.

According to some embodiments, a data port is provided on the front panel of the system. A data port, such as an Ethernet connection, allows a technician to connect a laptop computer or other portable equipment to the system. With the laptop computer, the technician may run the same or equivalent interface software on the laptop computer that runs at the remotely positioned workstation. By providing a data port, the technician may fully control the system locally with the laptop computer. Therefore, it may no longer be necessary to provide a control panel on the front panel of the system. Full control may be provided locally via the laptop computer.

Accordingly, in some embodiments, the control panel is replaced with a simplified control panel. The simplified control panel may include just a small LCD display, or a small LCD display and a keypad having number keys and a few function keys. In other embodiments, the control panel is completely removed. The simplification or removal of the control panel results in a system with fewer parts and a potential cost savings.

FIG. 1B shows a side view of a mountable unit of electronic equipment 100 having a fold-down workshelf 110 in a protruding and usable position. Similarly, FIG. 1C shows a perspective view of a mountable unit of electronic equipment 100 having a fold-down workshelf 110 in an extended and operable position. The extended workshelf 110 provides a horizontal surface on which a technician may place portable equipment or may write notes.

Most portable equipment incorporates a data port, such as an Ethernet, serial, parallel, USB, firewire or wireless interface. A corresponding data port 140 on the mounted equipment 100 or face of a cabinet may be used to connect the portable equipment with the mounted equipment 100 or other equipment in the cabinet. Additionally, the equipment 100 or face of the cabinet may include a power switch for providing power to the equipment 100. For example, the workshelf 110 may be extended thereby exposing the data port 140 and a power switch. A portable laptop computer may be placed on the extended workshelf 110 and connected to the now exposed data port 140. If power cycling of the equipment 100 is desired, the now exposed power switch may be turned off and on. The technician may then begin work, for example, initiating command and control software, configuring the system, and monitoring the equipment in the cabinet.

In the case of a tape library system, a laptop computer may be placed on the workshelf 110 and connected to the system through a front panel data port 140. The data port 140 may provide capabilities of local monitoring, command and control, configuring and diagnostic testing of the tape library system. By providing a laptop computer or a piece of portable equipment having a data port connectable to data port 140, a technician may effectively have a complete user interface to locally control the automated tape library system.

A tape library system having a data port 140 on the front panel or front face 130 may minimize or eliminate the need for other user interface hardware on the front panel. For example, a keypad on the front panel may be removed from the design of the system. With fewer pieces of front face hardware, the material parts cost of the system may be reduced. Additionally, a front face 130 containing just a data part 140 and no displays or keypads may eliminate software that would otherwise be required to support front panel display and control hardware.

Figure 2A:
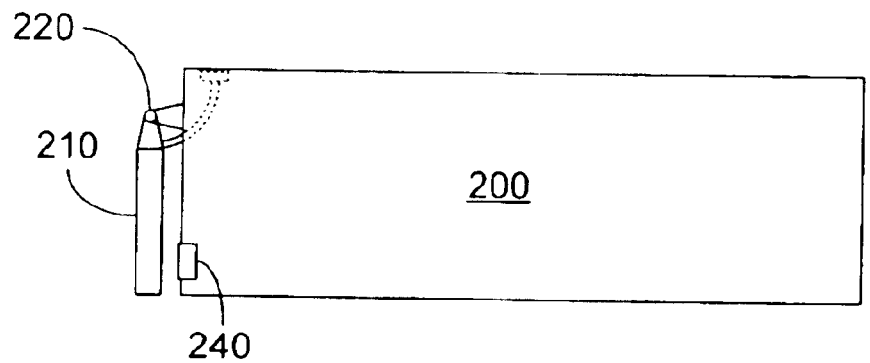
FIGS. 2A and 2B show side views of a unit of electronic equipment having a fold-up work surface.
Figure 2B:
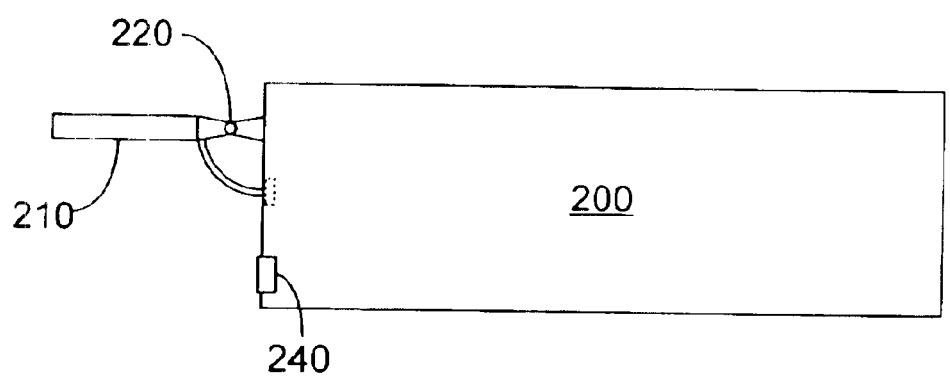

FIGS. 2A and 2B show an alternate embodiment of a mountable unit of electronic equipment 200 having a fold-up workshelf 210. FIG. 2A shows a side view of a mountable unit of electronic equipment 200 having a fold-up workshelf 210 in a stowed position, thereby covering a data port 240. FIG. 2B shows the unit of electronic equipment 200 with the fold-up workshelf 210 in an extended position thereby providing a useable work surface as well as exposing the data port 240. When folded up, a laptop computer may be place on the workshelf 210 and a connection may be formed between the laptop computer and equipment 200. Since the data port 240 is below the workshelf 210, potential physical interference between the data port 240 and the laptop computer may be reduced.

In other exemplary embodiments, a shelf is provided as a pull-out shelf incorporated into equipment installable in a rack-mount cabinet. By incorporating the shelf into otherwise empty space of equipment to be mounted in a cabinet or rack frame, otherwise unused space may be made functional. A technician pulls the workshelf out from the equipment to provide a temporary work surface. When the user no longer needs the work surface, the workshelf is pushed back into the equipment.

Figure 3A:
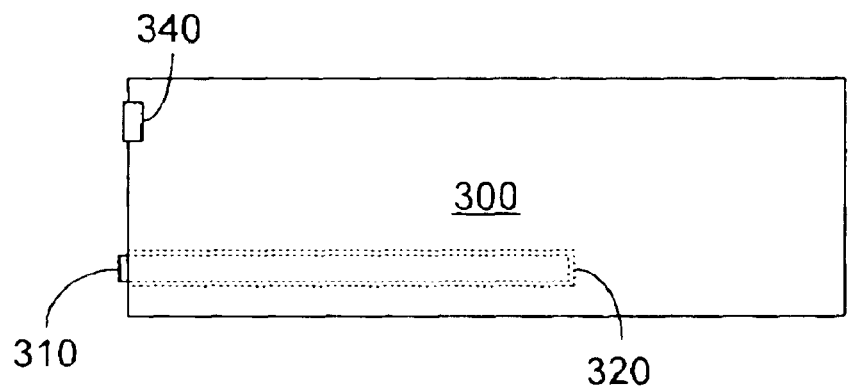
FIGS. 3A and 3B show side views of a unit of electronic equipment having a slide-out work surface.
Figure 3B:
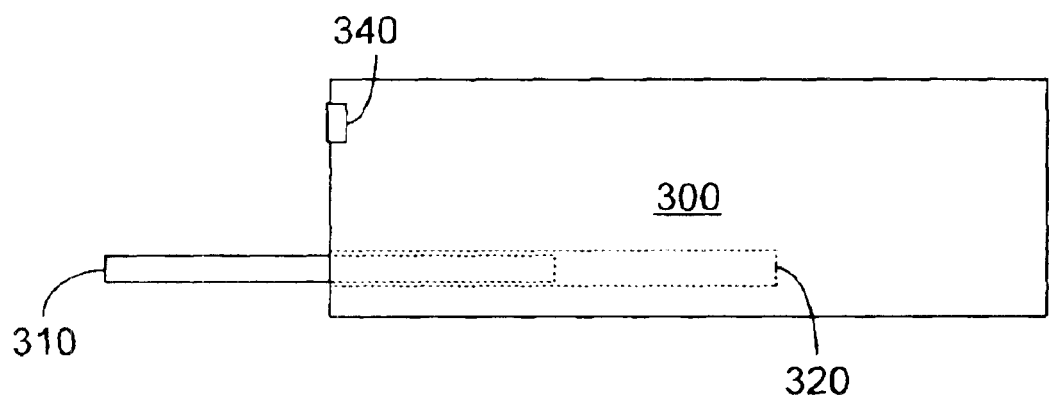

FIGS. 3A and 3B show side views of a mountable unit of electronic equipment 300 having a slide-out workshelf 310. FIG. 3A shows a workshelf 310 in a stowed position. FIG. 3B shows a workshelf 310 in an extended and operable position. A slide-out workshelf 310 may provide more mechanical support than fold-out workshelves 110 and 210. Additionally, a slide-out workshelf 310 may provide a deeper work surface than other surfaces might provide.

In some exemplary embodiments, a shelf is incorporated into cabinet containing a mass data storage system, such as an automated tape library system. A technician extends the workshelf from the cabinet to provide a temporary work surface. The workshelf may be attached to the cabinet or rack frame face. When the technician no longer needs the work surface, the workshelf is stowed back to the cabinet or rack such that it no longer protrudes in and interferes with the area in front of the cabinet or rack.

Figure 4A:
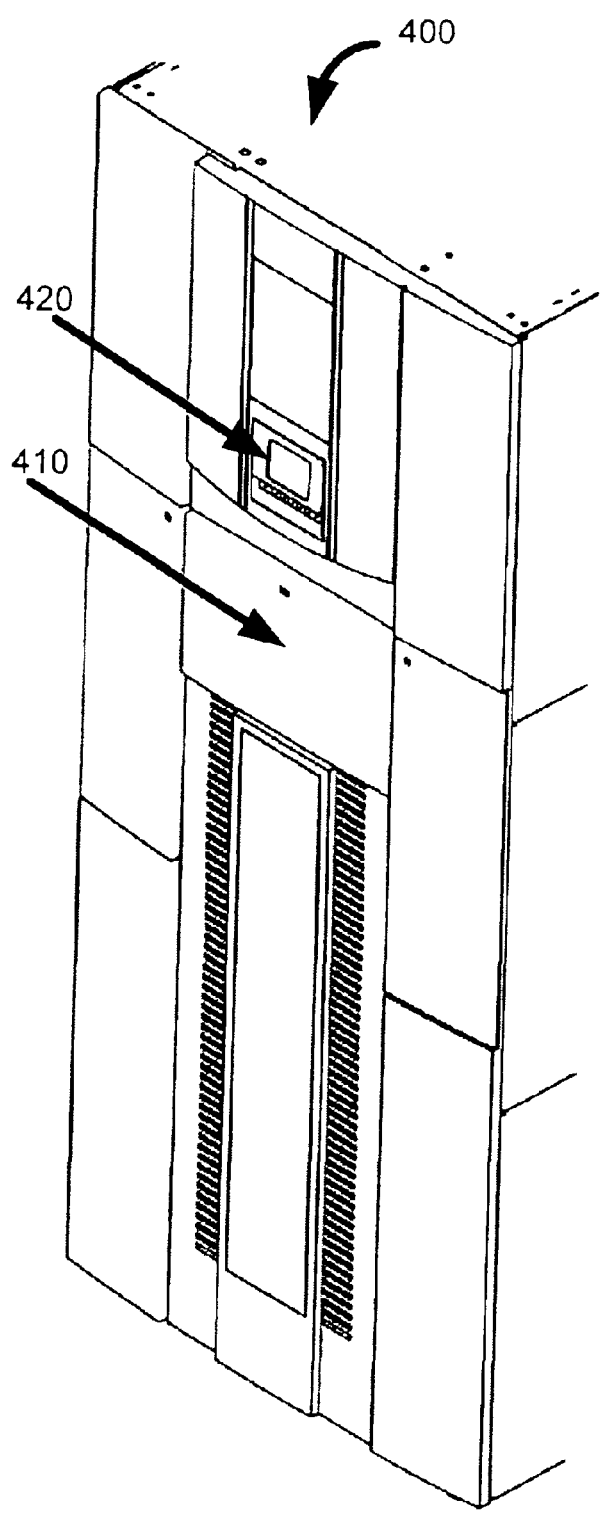
FIGS. 4A, 4B and 4C show perspective views of a cabinet containing equipment with a fold-up work surface.
Figure 4B:
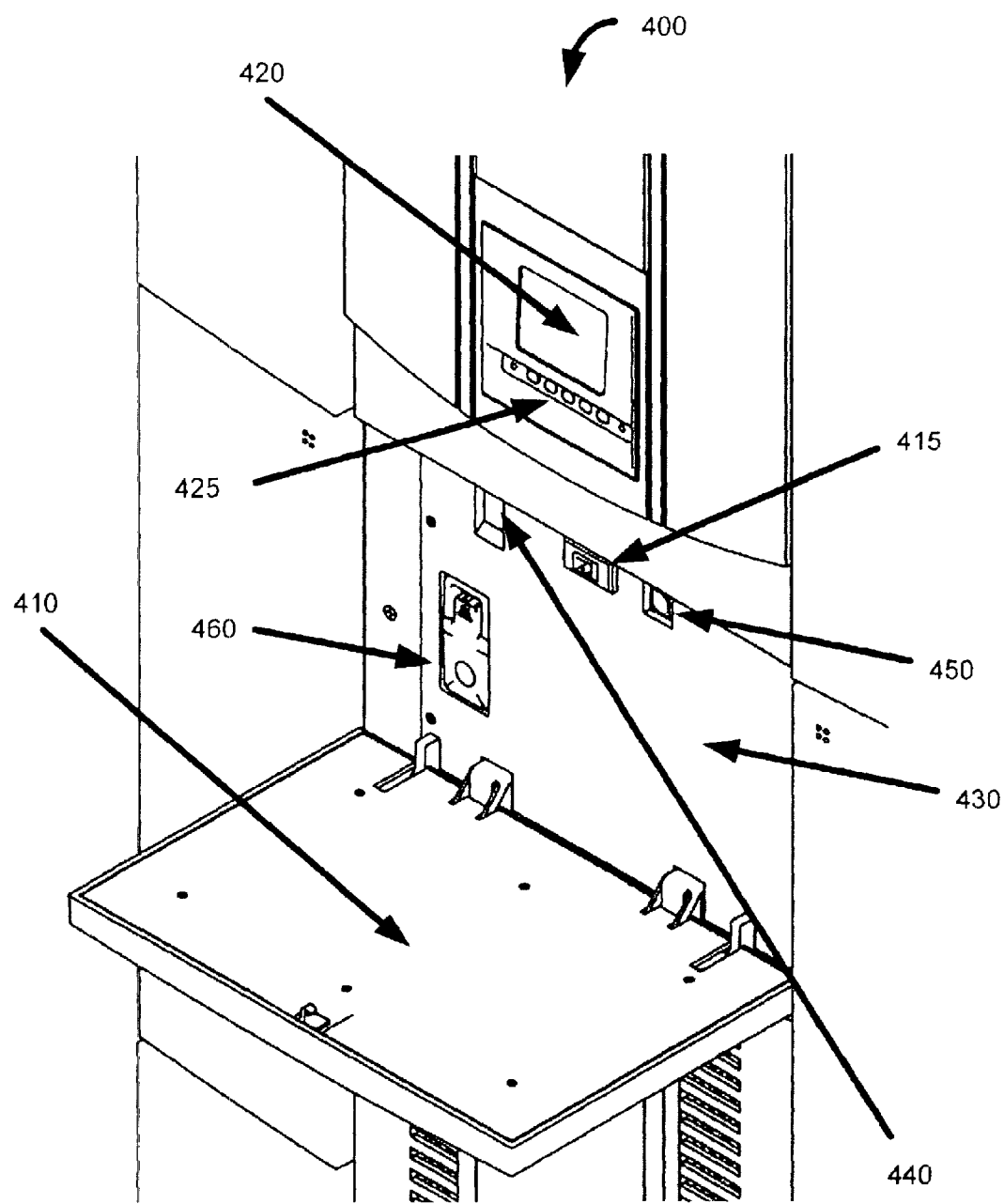
Figure 4C:
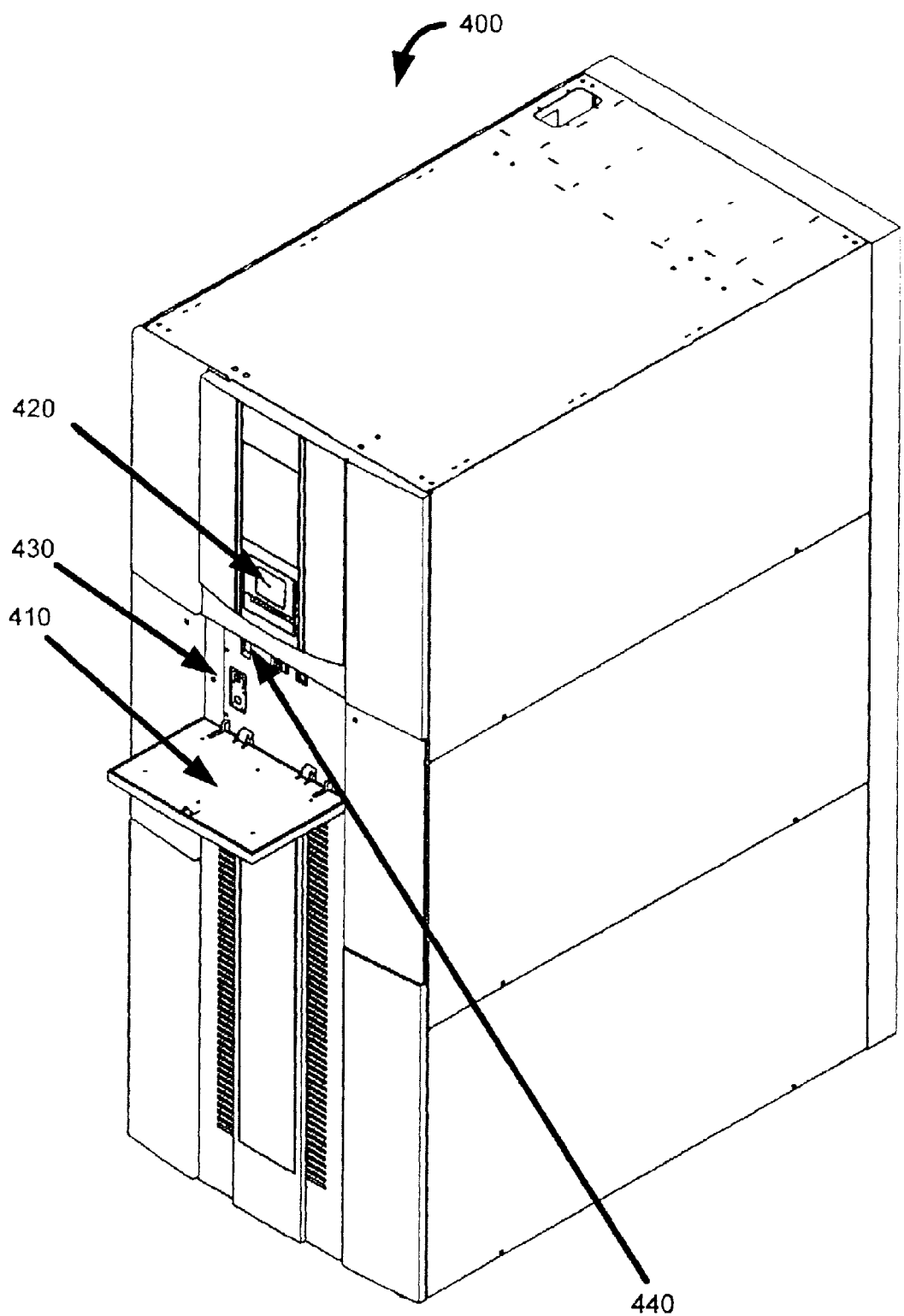

FIGS. 4A, 4B and 4C show perspective views of a cabinet 400 containing a fold-down workshelf 410. FIG. 4A shows the front of a cabinet 400 with a workshelf 410 in a stowed position. FIG. 4B shows the front of a cabinet 400 with a workshelf 410 in an extended position. FIG. 4C shows a full perspective view of a cabinet 400 with a workshelf 410 in an extended position. The cabinet 400 may include a display 420, which may be used to display status of equipment in the cabinet. The cabinet 400 may also include function keys 425, which may be used in conjunction with the display 420 for rudimentary control and status checking of the electronic equipment in the cabinet 400.

In some embodiments, a workshelf 410 and front panel 430 include a workshelf latch 415. The workshelf latch 415 holds the workshelf 410 in its stowed position using a spring mechanism. Alternatively, the workshelf latch 415 may more securely hold the workshelf 430 in position using a key lock mechanism or the like.

When stowed, the workshelf 410 covers a portion of the front panel of the cabinet 400, as shown in FIG. 4A. When extended, the workshelf 410 exposes a portion of a face plate 430, as shown in FIGS. 4B and 4C. When the workshelf 410 is moved from its stowed position to its extended position, one or more functional units previously blocked by the workshelf 410 may be exposed. Functional units include, for example, data interface ports, power switches, door latches, displays, keys pads and the like.

In some embodiments, an extended workshelf 410 exposes a data port 440. A laptop computer may be set on the extended workshelf 410 and a connection made between the laptop computer and the exposed data port 440. A technician may control, monitor or perform maintenance on the equipment mounted in the cabinet 400 locally from the laptop computer. Additionally, the workshelf 410 may be positioned on the cabinet at a height such that when extended, the workshelf 410 provides an ergonomic working surface for a technician of average height.

In some embodiments, an extended workshelf 410 exposes a power switch 450. The power switch 450 may be used to control power supplied to the electronic equipment in the cabinet 400. When in a stowed position, the workshelf 410 inhibits access to the power switch 450.

In some embodiments, an extended workshelf 410 exposes a door latch 460 for opening a door. The front panel 430 of the cabinet 400 may be attached to and part of a door. The door latch 460 is used to open the door. When the door swings open, the front panel swings with the door. When opened, the doorway allows access to the interior of the cabinet 400. When the workshelf 410 is in its stowed position, access to the door latch 460 may be blocked.

In some exemplary embodiments, a portion of the front panel where the workshelf is stowed is recessed to limit the protrusion of a stowed workshelf. In some exemplary embodiments, a front door to a cabinet housing the stowed workshelf contains a recess that accommodates the thickness of the workshelf when stowed. Still in other exemplary embodiments, a shelf may be detachable from the cabinet. When attached, the workshelf provides a work surface. When detached, the shelf may be conveniently stored elsewhere.

The above detailed description is provide to illustrate exemplary embodiments and is not intended to be limiting. It will be apparent to those skilled in the art that numerous modifications and variations within the scope of the present invention are possible. Accordingly, the present invention is defined by the appended claims and should not be limited by the examples described herein.

What is claimed is:

1. A cabinet comprising:
   a frame;
   a front panel including a data port; and
   a workshelf coupled to the frame, wherein the workshelf provides a working surface when the workshelf is in an extended position, and wherein the workshelf inhibits access to the data port when the workshelf is in a stowed position.

2. The cabinet of claim 1 further comprising a storage system, wherein the storage system is electrically coupled to the data port, and wherein the storage system may be monitored by a laptop computer connected to the data port.

3. The cabinet of claim 1, wherein the data port is an Ethernet port.

4. The cabinet of claim 1, wherein:
   the workshelf is pivotally mounted on the frame; and
   the workshelf covers at least a portion of the front panel when the workshelf is in the stowed position.

5. The cabinet of claim 4, wherein the front panel defines a recessed volume, wherein the recessed volume is at least partially occupied by the workshelf when the workshelf is in the stowed position.

6. The cabinet of claim 4, wherein the workshelf provides access to the data port when the workshelf is in the extended position.

7. The cabinet of claim 6, further comprising:
   electronic equipment;
   wherein the front panel further includes a power switch, wherein the power switch allows power to flow to the electronic equipment; and
   wherein the workshelf provides access to the power switch when the workshelf is in the extended position and inhibits access to the power switch when the workshelf is in the stowed position.

8. The cabinet of claim 6 further comprising a door coupled to the frame, wherein:
   the door includes a door latch positioned at the front panel; and the workshelf provides access to the door latch when the work shelf is in the extended position and inhibits access to the door latch when the workshelf is in the stowed position.

9. The cabinet of claim 1, wherein the cabinet further comprises a rack frame, wherein the rack frame provides rack mount supports.

10. The system of claim 1, the system further comprising electronic equipment, wherein:
the electronic equipment houses the workshelf on slides positioned internally within the electronic equipment;
a majority of the workshelf is housed within the electronic equipment when in a stowed position.

11. The system of claim 1, wherein the storage system is a tape library system.

12. A cabinet comprising:
a frame;
a front panel includes a data port, wherein the front panel defines a recessed volume;
a data storage system electrically coupled to the data port, wherein the data storage system allows interfacing to a laptop computer connected to the data port; and
a workshelf pivotally coupled to the frame, wherein
when the workshelf is in the stowed position, the workshelf inhibits access to the data port and the recessed volume is at least partially occupied by the workshelf; and
when the workshelf is in an extended position, the workshelf provides a working surface and provides access to the data port.

13. The cabinet of claim 12, wherein the data port is an Ethernet port.

14. The cabinet of claim 12, wherein:
the front panel further includes a power switch, wherein the power switch allows power to flow to the electronic equipment; and
the workshelf provides access to the power switch when the workshelf is in the extended position and inhibits access to the power switch when the workshelf is in the stowed position.

15. The cabinet of claim 12, further comprising a door coupled to the frame, wherein:
the door includes a door latch positioned at the front panel; and
the workshelf provides access to the door latch when the work shelf is in the extended position and inhibits access to the door latch when the workshelf is in the stowed position.

16. The system of claim 12, wherein the storage system is a tape library system.

17. A method of interfacing to a storage system wherein the storage system includes a workshelf and a front panel having a functional unit, the method comprising extending the workshelf from a first position to a second position, wherein the first position inhibits access to the functional unit, and wherein the second position provides a work surface and allows access to the functional unit.

18. The method of claim 17, wherein the functional unit is a data port.

19. The method of claim 18, further comprising:
positioning portable electronic equipment on the work surface;
coupling an electronic interconnection between the data port on the front panel and an interface on the portable electronic equipment; and
transmitting electronic signals along the electronic interconnection between the data port and the portable electronic equipment.

20. The method of claim 19, wherein the act of transmitting electronic signals includes sending control signals from the portable electronic equipment to the data port, wherein the control signals represent commands to control the storage system.

21. The method of claim 19, wherein the act of transmitting electronic signals includes receiving status signals at the portable electronic equipment from the data port, wherein the status signals represent a status of the storage system.

22. The method of claim 17, wherein the functional unit is a power switch.

23. The method of claim 22, further comprising activating the power switch thereby providing power to the storage system.

24. The method of claim 22, further comprising activating the door latch to open the door of the storage system.

25. The method of claim 17, wherein the functional unit is a door latch coupled to a door of the storage system.

* * * * *